United States Patent
Maeno et al.

[11] Patent Number: 5,659,474
[45] Date of Patent: Aug. 19, 1997

[54] DIAGNOSTIC APPARATUS FOR SQUIB LINE SYSTEM IN VEHICULAR AIR BAG SYSTEM

[75] Inventors: Yoshihiko Maeno, Kobe; Koichi Sugiyama, Nagoya; Takayuki Yamaguchi, Toyota, all of Japan

[73] Assignees: Fujitsu Ten Limited, Hyogo; Toyota Jidosha Kabushiki Kaisha, Aichi, both of Japan

[21] Appl. No.: 329,440

[22] Filed: Oct. 26, 1994

[30] Foreign Application Priority Data

Oct. 29, 1993  [JP]  Japan ................................. 5-272497

[51] Int. Cl.⁶ ....................................................... B60R 21/32
[52] U.S. Cl. ..................... 364/424.055; 307/10.1; 280/735; 340/436
[58] Field of Search ................... 364/424.03, 424.05; 280/728 R, 734, 735; 180/282; 340/436, 438; 307/10.1; 324/502

[56] References Cited

U.S. PATENT DOCUMENTS

| | | | |
|---|---|---|---|
| 4,851,705 | 7/1989 | Musser et al. | 307/10.1 |
| 4,893,109 | 1/1990 | Vrabel et al. | 340/438 |
| 4,980,573 | 12/1990 | White et al. | 307/10.1 |
| 4,987,316 | 1/1991 | White et al. | 340/436 |
| 5,187,465 | 2/1993 | Stonerook et al. | 340/438 |
| 5,268,643 | 12/1993 | Aso et al. | 324/502 |
| 5,409,258 | 4/1995 | Kawabata | 280/735 |

FOREIGN PATENT DOCUMENTS 1-306343  12/1989  Japan.

*Primary Examiner*—Gary Chin
*Attorney, Agent, or Firm*—Oliff & Berridge

[57] ABSTRACT

In a vehicular air bag system, a diagnostic apparatus for testing a squib line is provided which has: a first diagnostic resistor R1 one end of which is connected to a terminal D+ of a squib; a first diagnostic switching means Q1 for connecting the other end of the R1 to an ignition voltage VDC; a second diagnostic resistor R3 one end of which is connected to the terminal D+ of the squib; a second diagnostic switching means Q2 for connecting the other end of the R3 to ground; and a CPU. The CPU measures the potentials VD+ and VD− at the squib, by switching the first and second diagnostic switching means Q1 and Q2 on and off in an appropriate manner, and calculates the values of various prescribed diagnostic parameters on the basis of the value of VDC and the values of the VD+ and VD−. Then, the values of the diagnostic parameters are compared with various prescribed evaluation threshold values to determine the source of a failure.

14 Claims, 7 Drawing Sheets

DIAGNOSTIC APPARATUS FOR SQUIB LINE SYSTEM IN VEHICULAR AIR BAG SYSTEM

BACKGROUND OF THE INVENTION

1. Field of the Invention

The present invention relates to a vehicular air bag system, and more particularly to a diagnostic apparatus for testing a squib line system in such an air bag system.

2. Description of the Related Art

An air bag system is employed to protect passengers in the event of a vehicular collision. Such an air bag system includes, for example, a sensor installed in a vehicle to detect an impact, and an air bag installed in the steering wheel to protect the driver against the impact of a collision. If the sensor detects impact on the vehicle, a large current flows to the squib installed in the air bag, and the generated heat ignites the initiating explosive located close to the squib. Then, due to a chemical reaction initiated by the heat of the explosion, a large volume of nitrogen gas is generated in the air bag in a fraction of a second and inflates the air bag. When the air bag system is in use, the system must be monitored at all times for safety and proper operation.

There have previously been proposed squib line system diagnosis apparatus designed for vehicular air bag systems. One such apparatus is disclosed in Japanese Patent Unexamined Publication No. 1-306343. However, with the previously proposed apparatus, it is not possible to identify the source of a failure with sufficient accuracy. More specifically, it is not possible, for example, to distinguish between a failure of a resistor installed for diagnostic purposes and a failure of an internal resistor installed in the impact detection sensor. Furthermore, when a squib terminal is short-circuited to a battery line, there is a possibility that the trouble may be mistaken for a failure in a different part if the value of the voltage on the battery line is low.

SUMMARY OF THE INVENTION

It is accordingly an object of the present invention to provide a diagnostic apparatus, with an improved ability to identify and discriminate the source of a failure, for testing a squib line system in a vehicular air bag system.

According to the present invention, in a squib ignition circuit in a vehicular air bag system, which includes: a squib having a resistor RS; a safing sensor having a first terminal connected to an ignition power VDC, a second terminal connected to a first terminal of the squib, and an internal resistor R2 connected in parallel; a mechanical front right sensor having a first terminal connected to a second terminal of the squib, a second terminal connected to ground, and an internal resistor RF connected in parallel; a mechanical front left sensor having a first terminal connected to the second terminal of the squib, a second terminal connected to ground, and an internal resistor RF connected in parallel; and ignition switching means for grounding the second terminal of the squib in accordance with an output of a semiconductor acceleration sensor, there is provided a diagnostic apparatus for testing a squib line system, comprising: a first diagnostic resistor R1, the first terminal of which is connected to the first terminal of the squib; first diagnostic switching means Q1 for connecting a second terminal of the first diagnostic resistor R1 to the ignition power VDC; a second diagnostic resistor R3 the first terminal of which is connected to the first terminal of the squib; second diagnostic switching means Q2 for connecting a second terminal of the second diagnostic resistor R3 to ground; squib potential measuring means for measuring a first terminal potential VD+ and a second terminal potential VD− of the squib by switching the first and second switching means Q1 and Q2 on and off in an appropriate manner; diagnostic parameter value calculating means for calculating the values of various prescribed diagnostic parameters on the basis of the value of the VDC and various values of VD+ and VD− measured by the squib potential measuring means; and failure source determining means for determining the source of a failure by comparing the values of the various diagnostic parameters calculated by the diagnostic parameter value calculating means with various prescribed evaluation threshold values.

According to the invention, the diagnostic parameters are

PAF=(VD+ when Q1 is on and Q2 off)/VDC

PAO=(VD+ when Q1 and Q2 are on)/VDC

PBO=(VD− when Q1 and Q2 are on)/VDC

PAFF=(VD+ when Q1 and Q2 are off)/VDC

KDP1=PAO/PAF

KDP2=PAFF/PAF and the evaluation threshold values are

A=Value of PAO calculated with the resistance of R2 set to R2 open detection level B=Value of PAO calculated with the resistance of R2 set to infinity C=Value of KDP1 calculated with the resistance of R2 set to R2 open detection level D=Value of KDP1 calculated with the resistance of R1 set to R1 shorted detection level E=Value of KDP1 calculated with the resistance of R3 set to R3 shorted detection level F=Value of PBO calculated with the resistance of RS set to RS open detection level G=Value of KDP1 calculated on the assumption that RS is short-circuited to battery voltage line H=Value of KDP1 calculated with the combined resistance of both RFs set to both-RF open detection level I=Value of PAO calculated with the resistance of one RF set to infinity J=Value of PAF calculated with the resistance of one RF set to one-RF open detection level K=Value of KDP1 calculated with the resistance of one RF set to one-RF open detection level L=Value of KDP2 calculated with the resistance of R1 set to R1 open detection level.

According to the invention, the failure source determining means includes means for determining that the failure is due to either the first terminal or the second terminal of the squib being shorted to ground when the relationships (PAO<A and PAO<B and KDP1≧E) or (B≦PAO<A and KDP1≧C) hold.

According to the invention, the failure source determining means includes means for determining that the failure is due to either the first terminal or the second terminal of the squib being shorted to battery power when the relationship (PAO≧A and PBO≧F and KDP1>G and KDP2≧L) holds.

According to the invention, the failure source determining means includes means for determining that the failure is due to the squib being open when the relationship (PAO≧A and PBO<F) holds.

According to the invention, the failure source determining means includes means for determining that the failure is due to the internal resistor R2 of the safing sensor being open when the relationship (B≦PAO<A and KDP1<C and KDP2≧D) holds.

According to the invention, the failure source determining means includes means for determining that the failure is due to the internal resistor RF of either the front right sensor or the front left sensor being open when the relationships (PAO≧A and PBO≧F and KDP1≦G and KDP1>H and PAF>J and KDP1<E) or (PAO≧A and PBO≧F and KDP1≦G and KDP1≦H and PAO≦I and PAF>J and KDP1<K) hold.

According to the invention, the failure source determining means includes means for determining that the failure is due to the internal resistors RF of both the front right sensor and the front left sensor being open when the relationship (PAO≧A and PBO≧F and KKDP1≦G and KKDP1≦H and PAO>I)-holds.

According to the invention, the failure source determining means includes means for determining that the failure is due to the first diagnostic resistor R1 being open or the second diagnostic resistor R3 being shorted when the relationship (PAO<B and KDP1<E) holds.

According to the invention, the failure source determining means includes means for determining that the failure is due to the first diagnostic resistor R1 being shorted when the relationship (PAO≧A and PBO≧F and KDP1>G and KDP2<L) holds.

According to the invention, the failure source determining means includes means for determining that the failure is due to the second diagnostic resistor R3 being open when the relationship (B≦PAO<A and KDP1<C and KDP2>D) holds.

According to the present invention, in a squib ignition circuit in a vehicular air bag system, which includes: a squib having a resistor RS connected to an ignition power VDC; and at least one of constituents of the squib ignition circuit except said squib, there is provided a diagnosis apparatus for the squib ignition circuit, comprising: a variable resistor, a terminal of which connected to one terminal of said squib; squib potential measuring means for measuring a first terminal potential VD+ and a second terminal potential VD− of said squib whenever a resistance of said variable resistor is changed; diagnostic parameter value calculating means for calculating the values of a various prescribed diagnostic parameters on the basis of the value of said VDC, said resistance of said variable resistor and various values of VD+ and VD− measured by said squib potential measuring means; and failure constituent determining means for determining the constituent of a failure by comparing the value of said various diagnostic parameters calculated by said diagnostic parameter value calculating means with various predetermined evaluation threshold values.

BRIEF DESCRIPTION OF THE DRAWINGS

The present invention will be more fully understood from the description as set forth below with the accompanying drawings.

DESCRIPTION OF THE PREFERRED EMBODIMENTS

Figure 1:
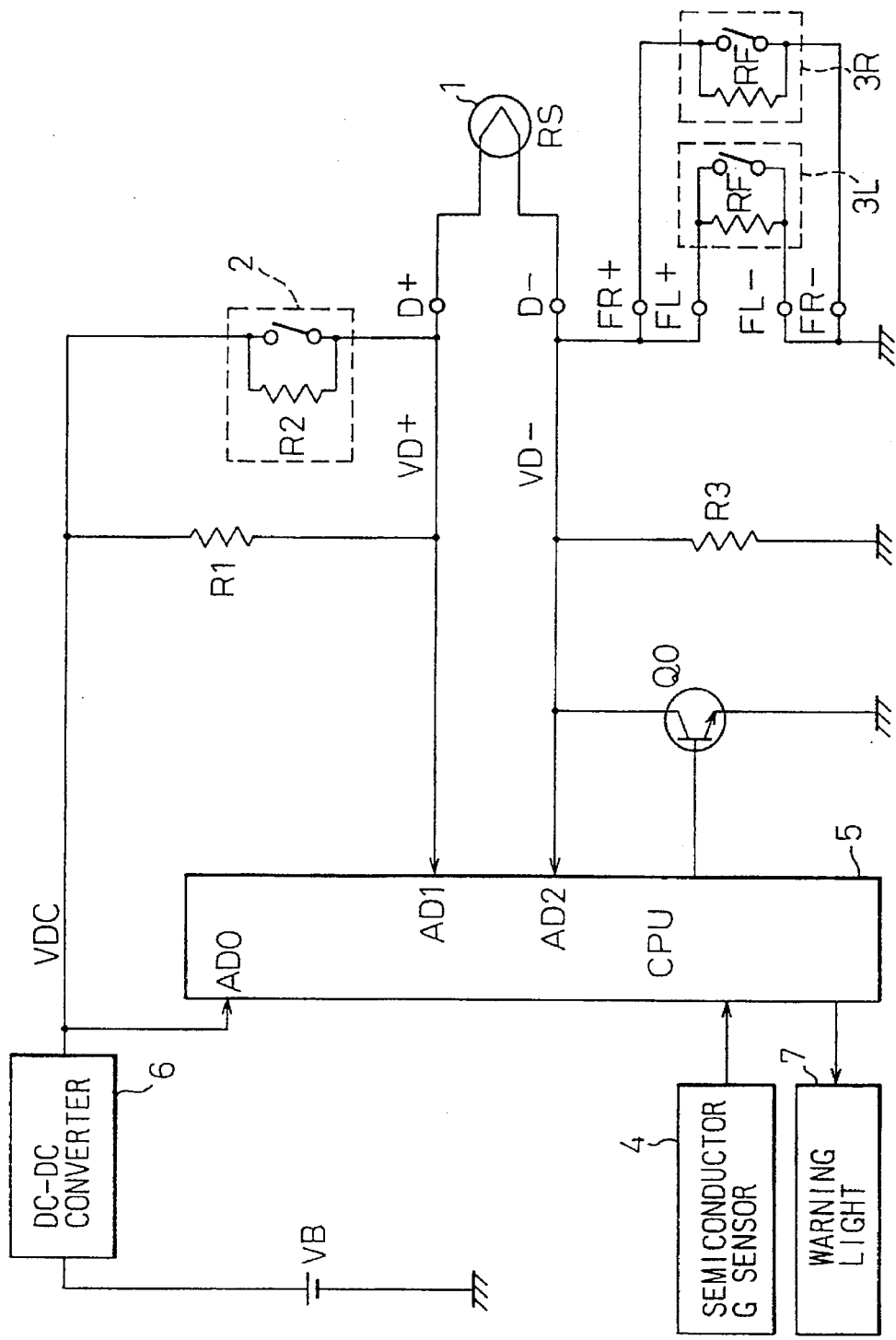
FIG. 1 is a block circuit diagram showing an example of a diagnosis apparatus for a squib line system in a vehicular air bag system according to the related art.

Before describing the preferred embodiments according to the present invention, an example of the related art is provided with reference to an accompanying drawing (FIG. 1).

FIG. 1 is a block circuit diagram showing an example of a diagnostic apparatus for a squib line system in a vehicular air bag system according to the related art. In the figure, the numeral 1 is a squib having a resistor RS; 2 is a safing sensor having an internal resistor R2; 3R and 3L are mechanical-type right and left front sensors, respectively, each having an internal resistor RF; 4 is a semiconductor acceleration sensor; 5 is a microprocessor (CPU); 6 is a DC-DC converter (with output ignition power VDC of, for example, 14 V); 7 is a warning light; Q0 is an ignition transistor; R1 and R3 are first and second diagnostic resistors, respectively; and VB is a battery (with a voltage of, for example, 8 V). The operation of the apparatus will be described below.

In the event of a vehicular collision, the sensors are closed by detecting the impact of the collision. More specifically, the safing sensor 2, which also serves to prevent erroneous activation, is mechanically closed. At the same time, the front sensors 3R and 3L are also mechanically closed. Furthermore, the semiconductor acceleration sensor 4 detects the impact and notifies the CPU 5 which then turns on the ignition transistor Q0. With the safing sensor 2 closed, and with either the front sensor 3R or 3L closed or the ignition transistor Q0 turned on, a large current flows through the squib, which causes the air bag to inflate as previously described.

During testing of the above squib line, a test current flows through the parallel combined resistance of the resistor R1 and resistor R2, the squib resistor RS, and the combined resistance of the two resistors RF and resistor R3 in parallel. Then, the CPU 5, which contains an A/D converter, measures potentials VD+ and VD− at both ends D+ and D− of the squib resistor RS through A/D conversion input terminals AD1 and AD2. Based on the thus measured potentials, the squib line system is checked for proper operation. If any error is detected, the warning light is turned on to indicate the occurrence of an error.

However, with the above circuit configuration, it is not possible to identify the source of a failure with sufficient accuracy. More specifically, it is not possible, for example, to distinguish between a failure of the diagnostic resistor R1 and a failure of the safing sensor internal resistor R2 or between a failure of the diagnostic resistor R3 and a failure of the front sensor internal resistor RF. Furthermore, in cases where the terminal D+ is short-circuited to the battery line VB, there is a possibility that the trouble may be mistaken for a failure of a different part if the value of the voltage VB is small.

The preferred embodiments of the present invention will now be described with reference to the accompanying drawings, FIGS. 2 to 7.

Figure 2:
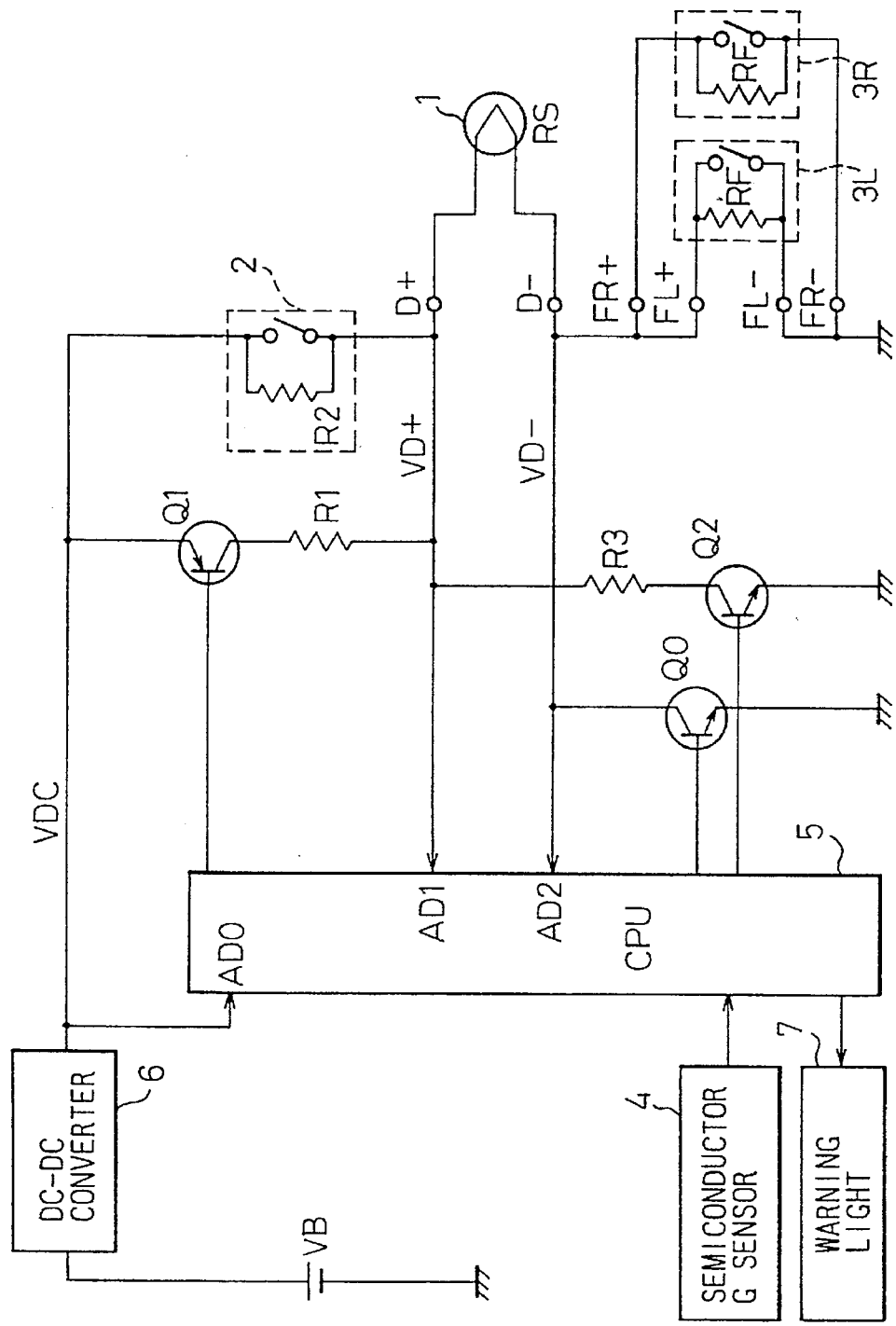
FIG. 2 is a block circuit diagram showing the hardware configuration of a diagnostic apparatus for a squib line system in a vehicular air bag system according to one embodiment of the present invention.

FIG. 2 is a block circuit diagram showing the circuit of a diagnostic apparatus for a squib line system in a vehicular air bag system according to one embodiment of the present invention. In FIG. 2, the parts that are the same as those in the circuit of the related art shown in FIG. 1 are designated by the same reference signs. The following description deals with differences from the circuit of the related art. First, the second diagnostic resistor R3 is connected to the D+ terminal of the squib 1, not to the D− terminal, and a transistor Q1 as a first diagnostic switching means is inserted between the first diagnostic resistor R1 and the ignition power VDC. Further, a transistor Q2 as a second diagnostic switching means is inserted between the second diagnostic resistor R3 and ground.

The diagnostic parameters used in the circuit configuration of FIG. 2 are, as previously described, as follows:

PAF=(VD+ when Q1 is on and Q2 off)/VDC

PAO=(VD+ when Q1 and Q2 are on)/VDC

PBO=(VD− when Q1 and Q2 are on)/VDC

PAFF=(VD+ when Q1 and Q2 are off)/VDC

KDP1=PAO/PAF

KDP2=PAPF/PAF

The following threshold values, against which the diagnostic parameters are evaluated, are calculated and are stored in a prescribed memory.

The threshold value A is the value of the parameter PAO calculated with the value of the safing sensor R2 set to open detection level R20. The calculation is given by equation (1).

$$A = \frac{\frac{\{RS+(RF/2)\}*R3}{R3+RS+(RF/2)}}{\frac{\{RS+(RF/2)\}*R3}{R3+RS+(RF/2)} + \frac{R1*R20}{R1+R20}} \quad (1)$$

The threshold value B is the value of the parameter PAO calculated with the value of the safing sensor R2 set to ∞. The calculation is given by equation (2).

$$B = \frac{\frac{\{RS+(RF/2)\}*R3}{R3+RS+(RF/2)}}{\frac{\{RS+(RF/2)\}*R3}{R3+RS+(RF/2)} + R1} \quad (2)$$

The threshold value C is the value of the parameter KDP1 calculated with the value of the safing sensor R2 set to open detection level R20. The calculation is given by equation (3).

$$C = \frac{\frac{\{RS+(RF/2)\}*R3}{R3+RS+(RF/2)}}{\frac{\{RS+(RF/2)\}*R3}{R3+RS+(RF/2)} + \frac{R1*R20}{R1+R20}} * \frac{RS+(RF/2)+\frac{R1*R20}{R1+R20}}{RS+(RF/2)} \quad (3)$$

The threshold value D is the value of the parameter KDP2 calculated with the value of the first diagnostic resistor R1 set to shorted detection level R1S. The calculation is given by equation (4).

$$D = \frac{RS+(RF/2)+\frac{R1S*R2}{R1S+R2}}{RF+(RF/2)+R2} \quad (4)$$

The threshold value E is the value of the parameter KDP1 calculated with the value of the second diagnostic resistor R3 set to shorted detection level R3S. The calculation is given by equation (5).

$$E = \frac{\frac{\{RS+(RF/2)\}*R3S}{R3S+RS+(RF/2)}}{\frac{\{RS+(RF/2)\}*R3S}{R3S+RS+(RF/2)} + \frac{R1*R2}{R1+R2}} * \frac{RS+(RF/2)+\frac{R1*R2}{R1+R2}}{RS+(RF/2)} \quad (5)$$

The threshold value F is the value of the parameter PBO calculated with the value of the squib RS set to open detection level RSO. The calculation is given by equation (6).

$$F = \frac{\frac{\{RS0+(RF/2)\}*R3}{R3+RS0+(RF/2)}}{\frac{\{RS0+(RF/2)\}*R3S}{R3S+RS0+(RF/2)} + \frac{R1*R2}{R1+R2}} * \frac{RF/2}{RS0+(RF/2)} \quad (6)$$

Figure 3:
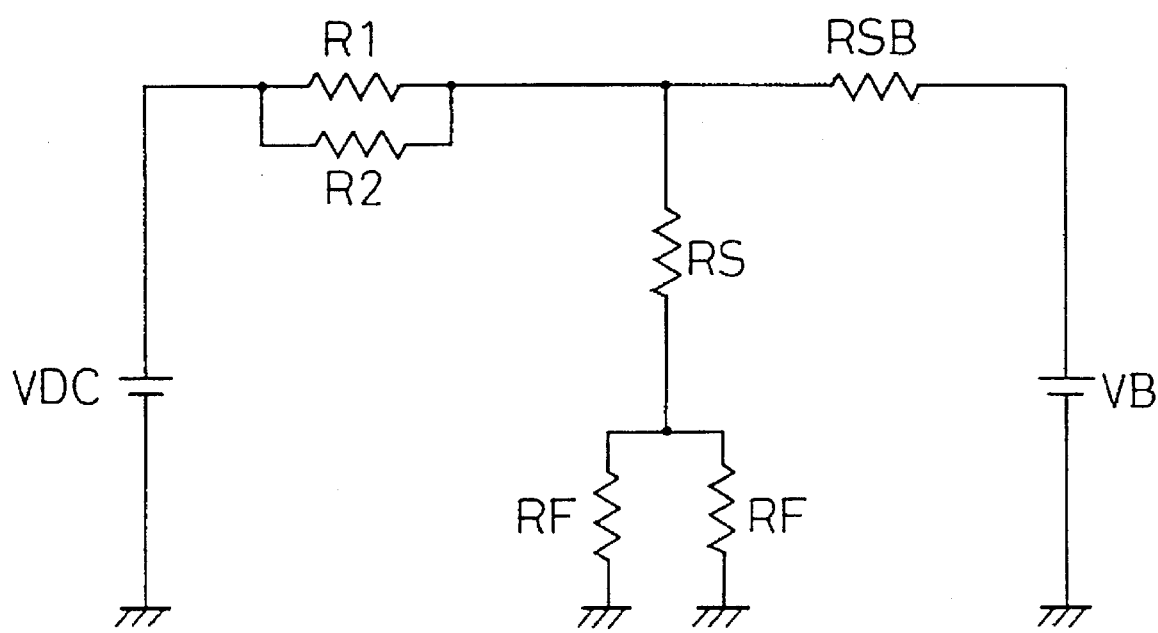
FIG. 3 is an equivalent circuit diagram for a squib RS short-circuited to a battery power VB via the resistance set to RSB.
Figure 4:
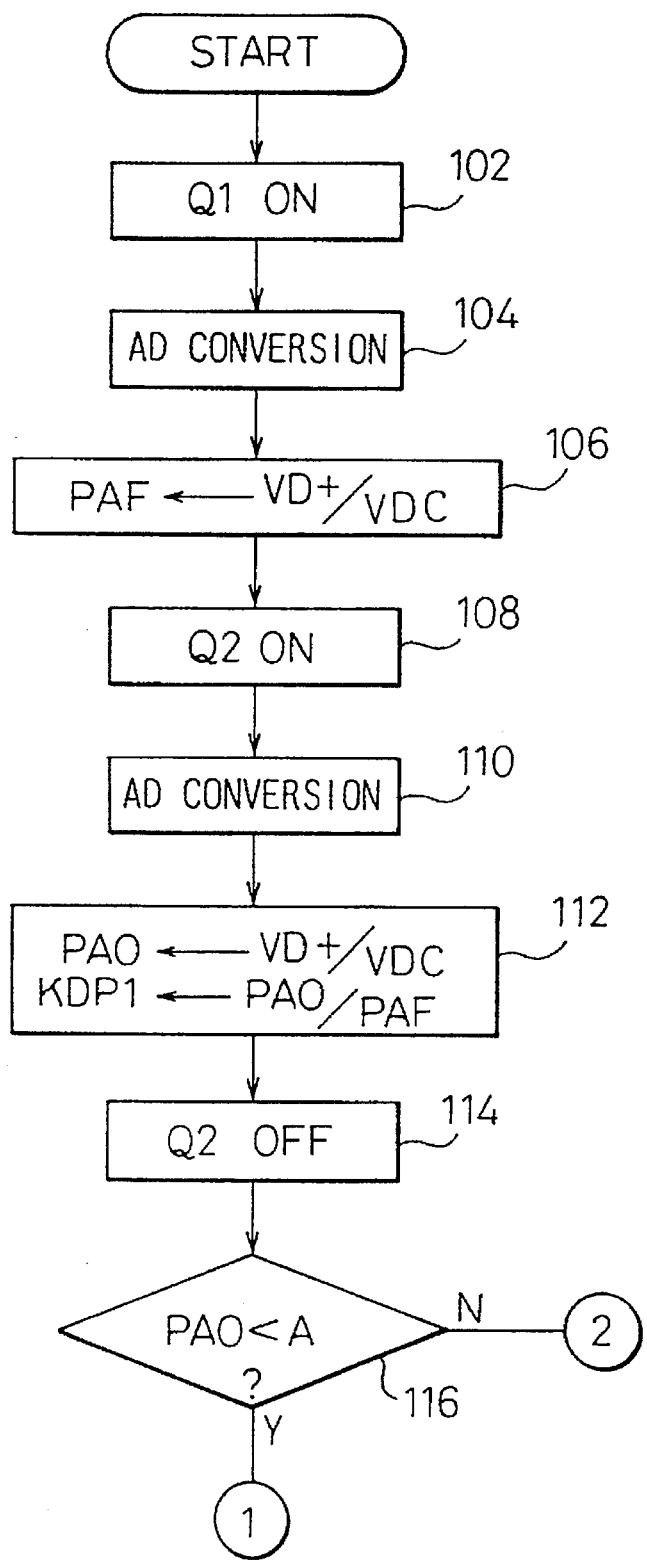
FIGS. 4 to 7 show a general flowchart illustrating diagnostic procedures in the squib line system diagnostic apparatus of FIG. 2.
Figure 5:
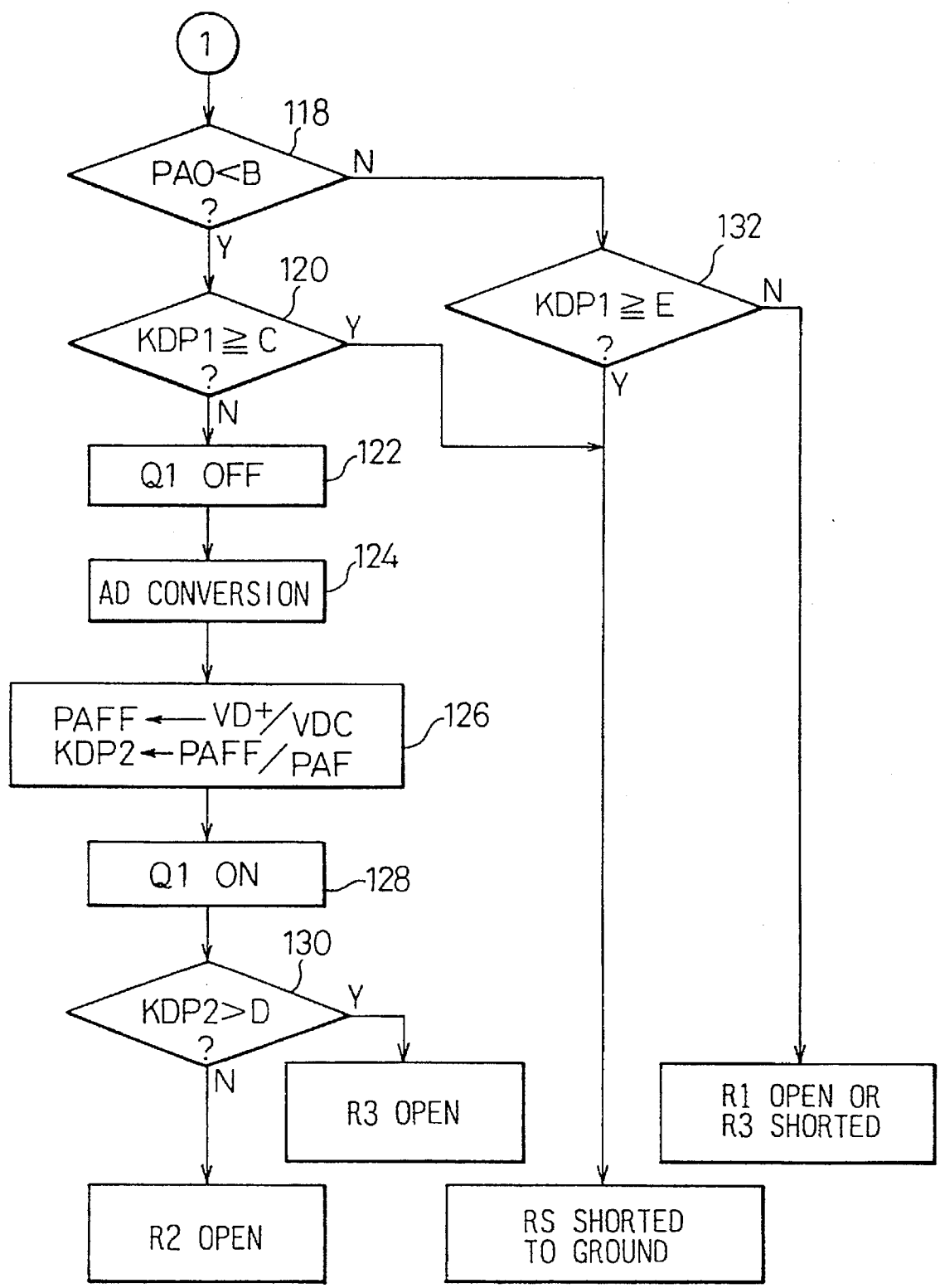
Figure 6:
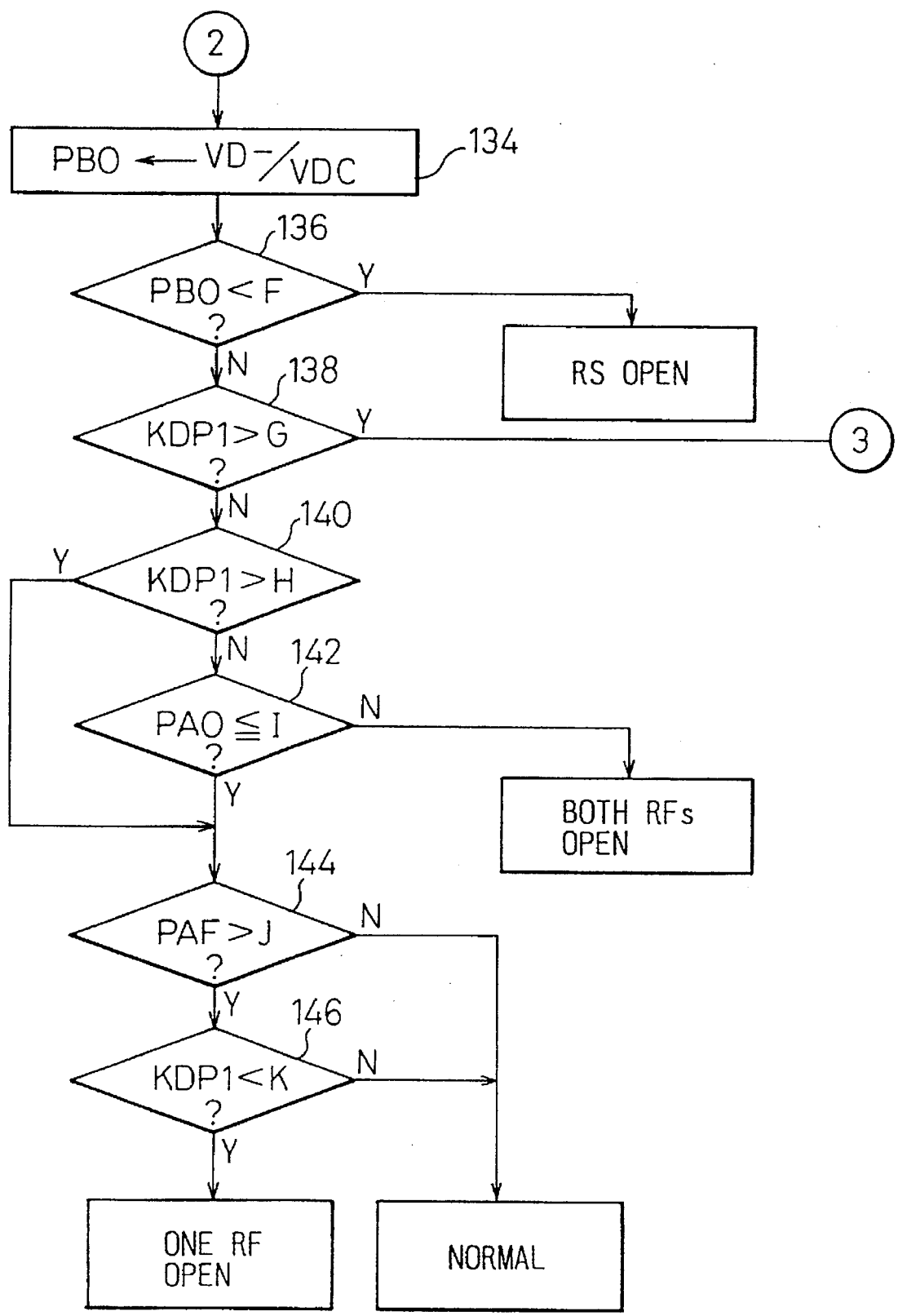
Figure 7:
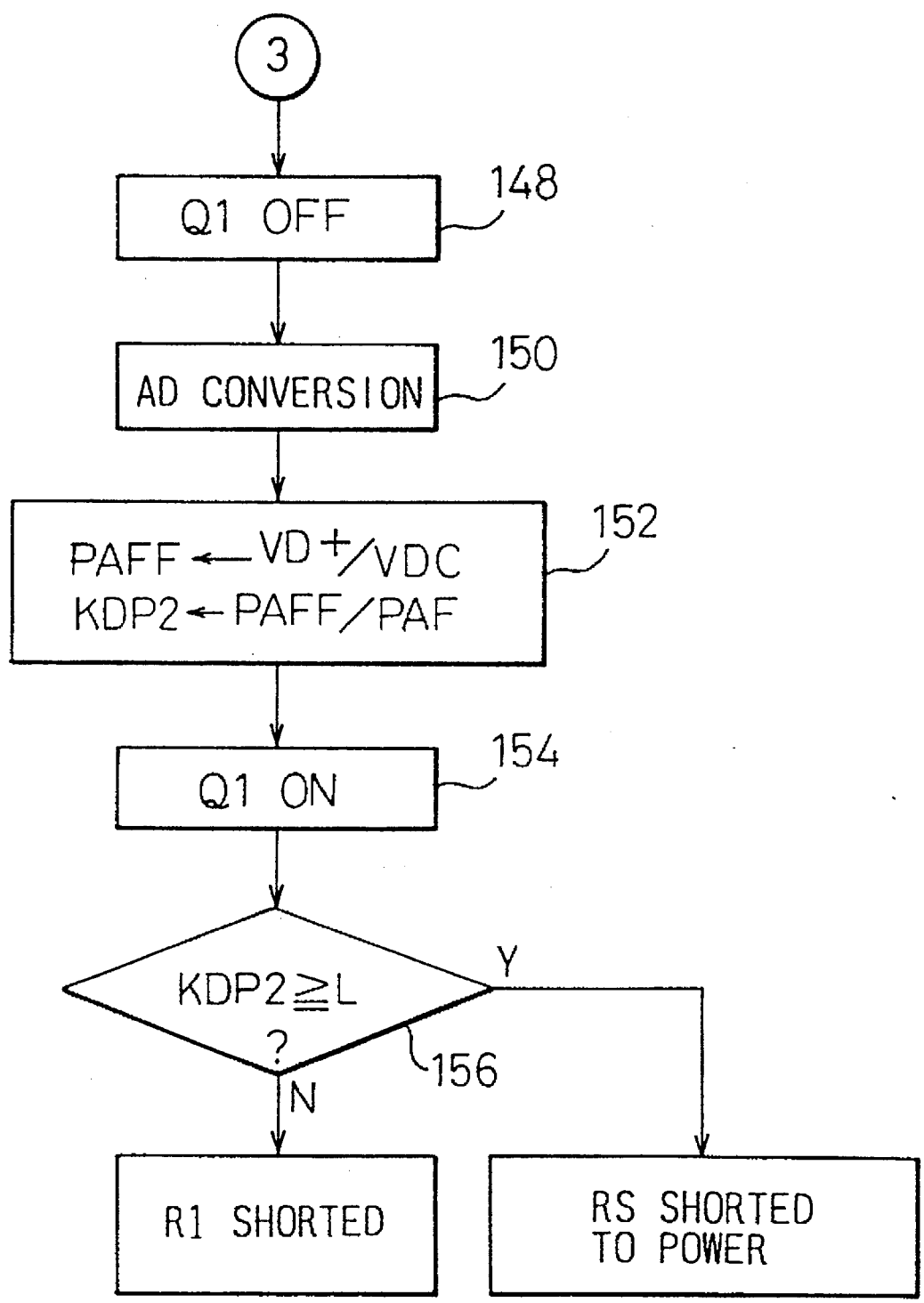

The threshold value G is the value of the parameter KDP1 when the squib RS is short-circuited to the battery VB (via the resistance set to RSB), that is, when the circuit shown in FIG. 3 is established. The calculation is given by equation (7).

$$G = \frac{VB - \frac{RSF'*VDC-(R12+RSF')VB}{RSF'^2-(RSB+RSF')(R12+RSF')}*RSB}{VB - \frac{RSF*VDC-(R12+RSF)VB}{RSF^2-(RSB+RSF)(R12+RSF)}*RSB} \quad (7)$$

where $RSF = RS + (RF/2)$ $RSF' = \frac{R3*RSF}{R3+RSF}$ $R12 = \frac{R1*R2}{R1+R2}$ The threshold value E is the value of the parameter KDP1 calculated with the combined resistance of both front sensor RFs set to both-RF open detection level RF20. The calculation is given by equation (8).

$$E = \frac{\frac{(RS+RF20)*R3}{R3+RS+RF20}}{\frac{(RS+RF20)*R3}{R3+RS+RF20} + \frac{R1*R2}{R1+R2}} * \frac{RS+RF20+\frac{R1*R2}{R1+R2}}{RS+(RF20)} \quad (8)$$

The threshold value I is the value of the parameter PAO calculated with the value of one front sensor RF set to ∞. The calculation is given by equation (9).

$$I = \frac{\frac{(RS+RF)*R3}{R3+RS+RF}}{\frac{(RS+RF)*R3}{R3+RS+RF} + \frac{R1*R2}{R1+R2}} \quad (9)$$

The threshold value J is the value of the parameter PAF calculated with the value of one front sensor RF set to open detection level RF1O. The calculation is given by equation (10).

$$J = \frac{RS+\frac{RF10*RF}{RF10+RF}}{\frac{RF10*RF}{RF10+RF}+RS+\frac{R1*R2}{R1+R2}} \quad (10)$$

The threshold value K is the value of the parameter KDP1 calculated with the value of one front sensor RF set to open detection level RF10. The calculation is given by equation (11).

$$K = \frac{\frac{(RS+RF10//RF1)*R3}{R3+RS+RF10//RF}}{\frac{(RS+RF10//RF)*R3}{R3+RS+RF10//RF} + \frac{R1*R2}{R1+R2}} * \frac{RS+RF10//RF+\frac{R1*R2}{R1+R2}}{RS+RF10//RF} \quad (11)$$

where $RF10//RF = \frac{RF10*RF}{RF10+RF}$

The threshold value L is the value of the parameter KDP2 calculated with the value of the first diagnostic resistor R1 set to open detection level R10. The calculation is given by equation (12).

$$L = \frac{RS + (RF/2) + \frac{R10 * R2}{R10 + R2}}{RS + (RF/2) + R2} \quad (12)$$

Since the above equations can be derived from Ohm's law and Kirchhoff's laws, the calculation processes will not be specifically described here. Referring now to the flowcharts of FIGS. 4 to 7 illustrating the diagnostic procedures of the CPU 5, we will describe how, using the precalculated threshold values, the diagnostic parameters are measured to determine the source of a failure.

First, when Q1 and Q2 are both off, Q1 is turned on (step 102). Next, the ignition voltage VDC and the potentials VD+ and VD− at both ends of the squib 1 are analog-digital (A/D) converted by the CPU 5 which receives them via the A/D conversion input terminals AD0, AD1, and AD2, and the obtained digital values are stored in a prescribed memory (step 104). Then, based on the values of VDC and VD+, the diagnostic parameter PAF is calculated (step 106). After that, Q2 is turned on (step 108) and A/D conversion is performed, in the same manner as above (step 110), to calculate the diagnostic parameter PAO and the parameter KDP1 (step 112), and Q2 is then turned off (step 114). Next, a comparison is made to determine whether the value of PAO is smaller than the precalculated threshold value A (step 116).

If the result of the comparison in step 116 is YES, then a comparison is made to determine whether PAO is smaller than the threshold value B (step 118). If the result of the comparison is YES, then a comparison is made to determine whether the value of KDP1 is not less than C (step 120). If the result of the comparison is YES, it is determined that the squib RS is shorted to ground. If NO, then Q1 is turned off (step 122), A/D conversion is performed (step 124), the parameters PAFF and KDP2 are calculated (step 126), and Q1 is turned on again (step 128). After that, a comparison is made to determine whether the value of KDP2 is larger than the threshold value D (step 130). If the result of the comparison is YES, it is determined that the failure is due to the second diagnostic resistor R3 being open. If NO, it is determined that the failure is due to the safing sensor R2 being open. Returning to step 118, if the result of the comparison in step 118 is NO, a comparison is made to determine whether the value of the parameter KDP1 is not less than the threshold value E (step 132). If the result of the comparison is YES, it is determined that the failure is due to the squib RS being shorted to ground; if NO, it is determined that the failure is due to the first diagnostic resistor R1 being open or the second diagnostic resistor R3 being shorted.

If the result of the comparison in step 116 is NO, then the value of the diagnostic parameter PBO is calculated (step 134), and a comparison is made to determine whether that value is smaller than the threshold value F (step 136). If the result of the comparison is YES, it is determined that the failure is due to the squib resistor RS being open. If NO, then a comparison is made to determine whether the value of KDP1 is larger than the threshold value G (step 138). If the result of the comparison is NO, a further comparison is made to determine whether KDP1 is larger than the threshold value H (step 140). If the result of the comparison in step 140 is NO, a comparison is made to determine whether the parameter PAO is not larger than the threshold value I (step 142), and if the result of the comparison is NO, it is determined that the failure is due to both front sensor RF being open. If the result of the comparison in step 140 is YES, or if the result of the comparison in step 142 is YES, then a comparison is made to determine whether the value of the parameter PAF is larger than the threshold value J (step 144). If the result of that comparison is YES, then a comparison is made to determine whether KDP1 is smaller than the threshold value K (step 146). If the result of the comparison is YES, it is determined that the failure is due to one front sensor RF being open. On the other hand, if the result of the comparison in step 144 is NO, or if the result of the comparison in step 146 is NO, it is determined that the squib line is operating properly.

If the result of the comparison in step 138 is YES, Q1 is turned off (step 148), A/D conversion is performed (step 150), PAFF and KDP2 are calculated (step 152), and Q1 is turned on again (step 154). After that, a comparison is made to determine whether KDP2 is not less than the threshold value L (step 156). If the result of the comparison is YES, it is determined that the failure is due to the squib resistor RS being shorted to the battery voltage line; if NO, it is determined that the failure is due to the first diagnostic resistor R1 being shorted. With the above processing steps, the squib line diagnosis is complete. In the above embodiment, since the diagnostic resistors R1 and R3 are mounted on a control board of the air bag system, the failure of any of these resistors is identified as an internal failure, and any other failure as an external failure. Thus, in the present invention, internal failure and external failure can be distinguished from each other, which has not been possible with the configuration of the related art.

The above description has dealt with one embodiment of the invention, but it will be appreciated that the invention is not limited to the above illustrated embodiment, and it will be easy for those skilled in the art to devise various other embodiments.

As described above, in the squib line system diagnosis apparatus of the above configuration, a diagnostic parameter value calculating means calculates the values of various diagnostic parameters, and a failure source determining means determines the source of a failure by comparing the parameter values with various evaluation threshold values.

Thus, according to the squib line system diagnosis apparatus in a vehicular air bag system subsumed under the present invention, the ability to identify and discriminate the source of a failure is increased, leading to increased ability to locate a failed part compared with the previous system, and thus providing the advantage of enhancing the efficiency of maintenance and repair work.

We claim:

1. In a squib ignition circuit, in a vehicular air bag system, which includes: a squib having a resistor RS; a safing sensor having a first terminal connected to an ignition power VDC, a second terminal connected to a first terminal of said squib, and an internal resistor R2 connected in parallel; a mechanical front right sensor having a first terminal connected to a second terminal of said squib, a second terminal connected to ground, and an internal resistor RF connected in parallel; a mechanical front left sensor having a first terminal connected to the second terminal of said squib, a second terminal connected to ground, and an internal resistor RF connected in parallel; and ignition switching means for grounding the second terminal of said squib in accordance with an output of a semiconductor acceleration sensor, a diagnosis apparatus for a squib line system, comprising:
        a first diagnostic resistor R1, a first terminal of which is connected to the first terminal of said squib;
        first diagnostic switching means Q1 for connecting a second terminal of said first diagnostic resistor R1 to said ignition power VDC;
        a second diagnostic resistor R3, a first terminal of which is connected to the first terminal of said squib;
        second diagnostic switching means Q2 for connecting a second terminal of said second diagnostic resistor R3 to ground;

squib potential measuring means for measuring a first terminal potential VD+ and a second potential VD− of said squib by switching said first and said second switching means Q1 and Q2 on and off in an appropriate manner;

diagnostic parameter value calculating means for calculating the values of various prescribed diagnostic parameters on the basis of the value of said VDC and various values of VD+ and VD− measured by said squib potential measuring means; and failure source determining means for determining the source of a failure by comparing the values of said various diagnostic parameters calculated by said diagnostic parameter value calculating means with various prescribed evaluation threshold values.

2. The diagnosis apparatus for a squib line system in a vehicular air bag system according to claim 1, wherein said diagnostic parameters are PAF=(VD+ when Q1 is on and Q2 off)/VDC
PAO=(VD+ when Q1 and Q2 are on)/VDC
PBO=(VD− when Q1 and Q2 are on)/VDC
PAPF=(VD+ when Q1 and Q2 are off)/VDC
KDP1=PAO/PAF
KDP2=PAFF/PAF and said evaluation threshold values are A=Value of PAO calculated with the resistance of R2 set to R2 open detection level
B=Value of PAO calculated with the resistance of R2 set to infinity
C=Value of KDP1 calculated with the resistance of R2 set to R2 open detection level
D=Value of KDP1 calculated with the resistance of R1 set to R1 shorted detection level
E=Value of KDP1 calculated with the resistance of R3 set to R3 shorted detection level
F=Value of PBO calculated with the resistance of R2 set to RS open detection level
G=Value of KDP1 calculated on the assumption that RS is short-circuited to battery voltage line
H=Value of KDP1 calculated with the combined resistance of both RFs set to both-RF open detection level
I=Value of PAO calculated with the resistance of one RF set to infinity
J=Value of PAF calculated with the resistance of one RF set to one-RF open detection level
K=Value of KDP1 calculated with the resistance of one RF set to one-RF open detection level
L=Value of KDP2 calculated with the resistance of R1 set to R1 open detection level.

3. The diagnosis apparatus for a squib line system in a vehicular air bag system according to claim 2, wherein said failure source determining means includes means for determining that the failure is due to either the first terminal or the second terminal of said squib being shorted to ground, when the relationship $(PAO<A \text{ and } PAO<B \text{ and } KDP1 \leq E)$ or the relationship $(B \leq PAO<A \text{ and } KDP1 \geq C)$ is true.

4. The diagnosis apparatus for a squib line system in a vehicular air bag system according to claim 2, wherein said failure source determining means includes means for determining that the failure is due to either the first terminal or the second terminal of said squib being shorted to battery power, when the relationship $(PAO \geq A \text{ and } PBO \geq F \text{ and } KDP1>G \text{ and } KDP2 \geq L)$ is true.

5. The diagnosis apparatus for a squib line system in a vehicular air bag system according to claim 2, wherein said failure source determining means includes means for determining that the failure is due to said squib being open, when the relationship $(PAO \geq A \text{ and } PBO<F)$ is true.

6. The diagnosis apparatus for a squib line system in a vehicular air bag system according to claim 2, wherein said failure source determining means includes means for determining that the failure is due to the internal resistor R2 of said safing sensor being open, when the relationship $(B \leq PAO<A \text{ and } KDP1<C \text{ and } KDP2 \leq D)$ is true.

7. The diagnosis apparatus for a squib line system in a vehicular air bag system according to claim 2, wherein said failure source determining means includes means for determining that the failure is due to the internal resistor RF of either said front right sensor or said front left sensor being open, when the relationship $(PAO \geq A \text{ and } PBO<F \text{ and } KDP1 \leq G \text{ and } KDP1>H$ and $PAF>J \text{ and } KDP1<K)$ or the relationship $(PAO \leq A \text{ and } PBO>F \text{ and } KDP1 \leq G \text{ and } KDP1 \leq H$ and $PAO \leq I \text{ and } PAF>J \text{ and } KDP1<E)$ is true.

8. The diagnosis apparatus for a squib line system in a vehicular air bag system according to claim 2, wherein said failure source determining means includes means for determining that the failure is due to the internal resistors RF of both said front right sensor and said front left sensor being open, when the relationship $(PAO>A \text{ and } PBO \leq F \text{ and } KDP1 \leq G \text{ and } KDP1 \leq H$ and $PAO>I)$ is true.

9. The diagnosis apparatus for a squib line system in a vehicular air bag system according to claim 2, wherein said failure source determining means includes means for determining that the failure is due to said first diagnostic resistor R1 being open or said second diagnostic resistor R3 being shorted, when the relationship $$(PAO<B \text{ and } KDP1<E)$$

is true.

10. The diagnosis apparatus for a squib line system in a vehicular air bag system according to claim 2, wherein
said failure source determining means includes means for determining that
the failure is due to said first diagnostic resistor R1 being shorted,
when the relationship $$(PAO \leqq A \text{ and } PBO \geqq F \text{ and } KDP1 > G \text{ and } KDP2 < L)$$

is true.

11. The diagnosis apparatus for a squib line system in a vehicular air bag system according to claim 2, wherein
said failure source determining means includes means for determining that
the failure is due to said second diagnostic resistor R3 being open,
when the relationship $$(B \leqq PAO < A \text{ and } KDP1 < C \text{ and } KDP2 > D)$$

is true.

12. In a squib ignition circuit in a vehicular air bag system, which includes: a squib having a resistor RS connected to an ignition power VDC; and at least one of constituents of the squib ignition circuit except said squib,
a diagnosis apparatus for the squib ignition circuit comprising:
a variable resistor, a terminal of which is connected to one terminal of said squib;
squib potential measuring means for measuring a first terminal potential VD+ and a second terminal potential VD− of said squib whenever a resistance of said variable resistor is changed;
diagnostic parameter value calculating means for calculating the values of various prescribed diagnostic parameters on the basis of the value of said VDC, said resistance of said variable resistor and various values of VD+ and VD− measured by said squib potential measuring means; and
failed constituent determining means for determining which constituent has failed in a failed squib ignition circuit by comparing the values of said various diagnostic parameters calculated by said diagnostic parameter value calculating means with various predetermined evaluation threshold values.

13. A squib ignition circuit in a vehicular air bag system, comprising:
a squib having a resistor connected to an ignition power;
a safing sensor connected to said squib and said ignition power and at least one of the constituents of a squib ignition circuit except said squib; and
a diagnosis apparatus for the squib ignition circuit, comprising:
a variable resistor, a terminal of which is connected to one terminal of said squib and one terminal of said safing sensor;
squib potential measuring means for measuring a first terminal potential and a second terminal potential of said squib whenever a resistance of said variable resistor is changed,
diagnostic parameter value calculating means for calculating values of various prescribed diagnostic parameters on the basis of the value of said ignition power, said resistance of said variable resistor and various values of the first and second terminal potentials measured by said squib potential measuring means, and
failed constituent determining means for determining which constituent has failed in a failed squib ignition circuit by comparing the values of said various diagnostic parameters calculated by said diagnostic parameter value calculating means with various predetermined evaluation threshold values.

14. In a squib ignition circuit in a vehicular air bag system, which includes: a squib having a resistor RS connected to an ignition power VDC; and at least one of constituents of the squib ignition circuit except said squib,
a diagnosis apparatus for the squib ignition circuit, comprising:
a variable resistor, a terminal of which is connected to one terminal of said squib;
squib potential measuring means for measuring a first terminal potential VD+ and a second terminal potential VD− of said squib;
changing means for generating signals to change a resistance value of said variable resistor; and
failure determining means for determining whether or not said squib is in failure depending on relationship between said first and second terminal potentials VD+, VD− and said resistance value to be obtained by said signals.

* * * * *